United States Patent
Hwang et al.

(10) Patent No.: US 7,220,601 B2
(45) Date of Patent: May 22, 2007

(54) METHOD OF FORMING NANO-SIZED MTJ CELL WITHOUT CONTACT HOLE

(75) Inventors: Soon-won Hwang, Seoul (KR); I-hun Song, Gyeonggi-do (KR); Geun-young Yeom, Seoul (KR); Seok-jae Chung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 141 days.

(21) Appl. No.: 11/033,830

(22) Filed: Jan. 13, 2005

(65) Prior Publication Data

US 2005/0158882 A1   Jul. 21, 2005

(30) Foreign Application Priority Data

Jan. 16, 2004   (KR) ................... 10-2004-0003237

(51) Int. Cl.
*H01L 21/00*   (2006.01)

(52) U.S. Cl. .................. 438/3; 438/257; 438/593; 438/E21.436; 438/E27.104; 257/295; 257/E29.164; 257/E29.272

(58) Field of Classification Search ............. 438/3; 257/295

See application file for complete search history.

(56) References Cited

U.S. PATENT DOCUMENTS

| | | | |
|---|---|---|---|
| 5,607,599 A | * | 3/1997 | Ichihara et al. ............... 216/22 |
| 2003/0073253 A1 | * | 4/2003 | Okazawa et al. ............... 438/3 |
| 2005/0146927 A1 | * | 7/2005 | Costrini ....................... 365/174 |

FOREIGN PATENT DOCUMENTS

KR   2003-88574   11/2003

OTHER PUBLICATIONS

Korean Office Action dated Jul. 27, 2005.

* cited by examiner

*Primary Examiner*—Dung A. Le
(74) *Attorney, Agent, or Firm*—Buchanan Ingersoll & Rooney PC

(57) ABSTRACT

Provided is a method of manufacturing a nano-sized MTJ cell in which a contact in the MTJ cell is formed without forming a contact hole. The method of forming the MTJ cell includes forming an MTJ layer on a substrate, forming an MTJ cell region by patterning the MTJ layer, sequentially depositing an insulating layer and a mask layer on the MTJ layer, exposing an upper surface of the MTJ cell region by etching the mask layer and the insulating layer at the same etching rate, and depositing a metal layer on the insulating layer and the MTJ layer.

21 Claims, 7 Drawing Sheets

METHOD OF FORMING NANO-SIZED MTJ CELL WITHOUT CONTACT HOLE

BACKGROUND OF THE INVENTION

Priority is claimed to Korean Patent Application No. 2004-3237, filed on Jan. 16, 2004, in the Korean Intellectual Property Office, the disclosure of which is incorporated herein in its entirety by reference.

1. Field of the Disclosure

The present disclosure relates to a method of forming a nano-sized magnetic tunnel junction (MTJ) cell without a contact hole, and more particularly, to a method of forming a nano-sized MTJ cell in which a contact is formed in the MTJ cell without forming a contact hole.

2. Description of the Related Art

Flash memory is a type of nonvolatile memory that has an advantage in that data recorded in the memory is preserved even if power is turned off. However, the recording speed of data in flash memory is approximately one one-thousandth that of DRAM, and flash memory also has high power consumption. Also, there is, to some extent, a limit of data erasing and writing times. Therefore, research has gone into the advantages of the DRAM and the flash memory, that is, reading and recording at a high speed, low power consumption, and data preservation even if power is turned off. As a result of the research, ferroelectric RAM (FeRAM), ovonic unified memory (OVM), and MRAM have been introduced as non-volatile memory.

Magnetic random access memory (MRAM) is non-volatile memory in which a memory cell includes a magnetic tunnel junction (MTJ) that stores information using a tunneling magneto resistance effect. Referring to FIGS. 1A and 1B, an MTJ includes an insulating layer 200 (tunnel barrier layer) interposed between two ferromagnetic layers 100 and 300. Data stored in the MTJ depends on the direction of magnetization, i.e., whether the direction of the magnetization either same or opposite. That is, as depicted in FIG. 1A, if the directions of magnetization are parallel, the tunnel resistance of the insulating layer 200 (barrier layer) interposed between the two ferromagnetic layers 100 and 300 is minimized, and the MTJ is in a "1" state. On the other hand, as depicted in FIG. 1B, if the directions of magnetization are anti-parallel, the tunnel resistance of the insulating layer 200 is maximized, that is, the MTJ is in a "0" state. By utilizing these unique characteristics of the MTJ, the MTJ can function as a memory cell. Hereinafter, a memory cell including the MTJ will be called an MTJ cell for convenience.

FIGS. 2A through 2H are cross-sectional views illustrating a conventional method of forming an MTJ cell.

Referring to FIG. 2A, an MTJ layer 220 and a hard mask layer 230 are sequentially formed on a substrate 10. After stacking a photo-resist 232, on a portion of the hard mask layer 230 in which an MTJ cell will be formed, the hard mask layer 230 is dry etched using the photo-resist 232 as an etch mask. Referring to FIG. 2B, the photo-resist 232 is then removed.

Next, a remaining portion of the hard mask layer 230 and a portion of the MTJ layer 220 are dry etched (FIG. 2C), and then an insulating layer 240 is deposited on the resultant product (FIG. 2D). Then, referring to FIG. 2E, a mask layer 235 for forming a contact hole 260 is coated on the insulating layer 240, and then, a contact hole is patterned by performing lithography using a Kr stepper. Then, referring to FIG. 2F, central portions of the insulating layer 240 and the photo mask 235 are etched, thereby forming the contact hole 260 in the middle of the MTJ cell. Finally, the mask layer 235 is removed (FIG. 2G) and a metal layer 250 is coated on the resultant product (FIG. 2H) to complete the manufacturing of the MTJ cell.

A memory cell formed in this manner can record and reproduce at high speeds and has lower power consumption, and an unlimited number of data corrections can be made.

However, for practical applications, high integration of the MRAM is essential. Therefore, the MTJ cell must have a width less than 100 nm. However, it is difficult to manufacture an MTJ cell having a width less than 100 nm using the present technique. If the MTJ cell is manufactured according to a conventional method, a contact has to be formed after forming a contact hole having a diameter much less than 100 nm in the MTJ cell with a width of 100 nm. Thus, it is impossible to form an MTJ cell having a width less than 100 nm using conventional methods. The size of conventional MTJ cells developed is no smaller than 400× 800 nm, which is much greater than the required size for high integration. That is, the applicability of conventional MRAM is very low. Moreover, when an MTJ cell is formed according to a conventional method, a resistance of the contact is high since the contact hole is very small, thereby causing errors during recording and reproducing data and increasing power consumption.

SUMMARY OF THE DISCLOSURE

Embodiments of the present disclosure provide a method of manufacturing an MTJ cell having a width less than a size of 100 nm that enables high integration of a magnetic memory.

Embodiments of the present disclosure also provide a method of forming a nano-sized MTJ cell with a low contact hole resistance. The method avoids difficulties in forming a small-sized contact hole by forming a contact without forming a contact hole.

Embodiments of the present disclosure also provide a method of forming a nano-sized MTJ cell with fast and low costs by removing a process for forming a contact hole.

According to an aspect of the present disclosure, there is provided a method of forming an MTJ cell, comprising forming an MTJ layer on a substrate, forming an MTJ cell region by patterning the MTJ layer, sequentially depositing an insulating layer and a mask layer on the MTJ layer, exposing an upper surface of the MTJ cell region by etching the mask layer and the insulating layer at the same etching rate, and depositing a metal layer on the insulating layer and the MTJ layer.

The MTJ layer includes a base layer that is conductive, a lower material layer having magnetic properties, an insulating layer, an upper material layer having magnetic properties, and a cap layer that is conductive stacked sequentially in one embodiment.

Forming the MTJ cell region by patterning the MTJ layer comprises depositing a hard mask on the MTJ layer, patterning the hard mask by first dry etching, and forming the MTJ cell region by second dry etching the MTJ layer to a predetermined depth using the hard mask as an etch mask in one embodiment.

The etching the insulating layer and the mask layer comprises third dry etching the insulating layer and the mask layer at the same etching rate, terminating the third dry etching when the MTJ cell region is exposed, and removing a remaining component of the mask layer in one embodiment.

BRIEF DESCRIPTION OF THE DRAWINGS

The above and other features and advantages of the present disclosure will become more apparent by describing in detail embodiments thereof with reference to the attached drawings in which.

DETAILED DESCRIPTION OF THE DISCLOSURE

The present disclosure will now be described more fully with reference to the accompanying drawings in which embodiments of the present disclosure, to which the present disclosure is not limited, are shown.

Figure 1A:
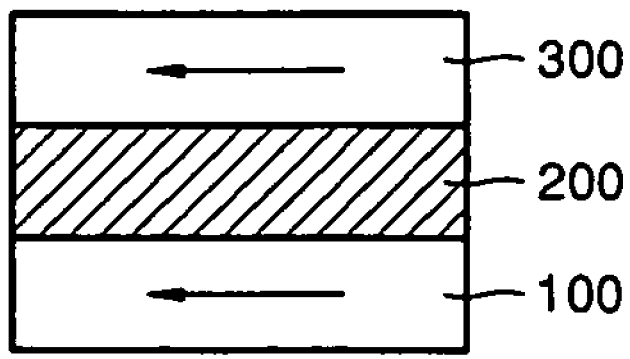
FIGS. 1A and 1B illustrate a configuration of an MTJ and a principle of recording information using the MTJ.
Figure 1B:
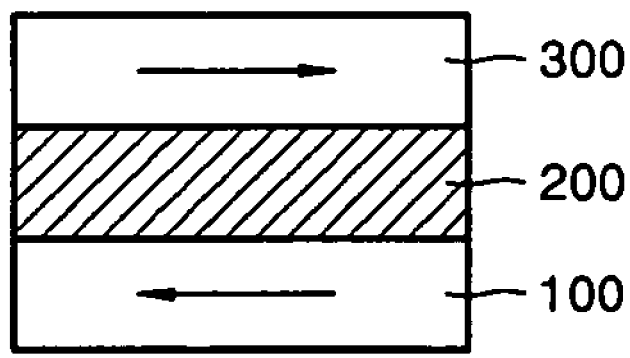
Figure 2A:
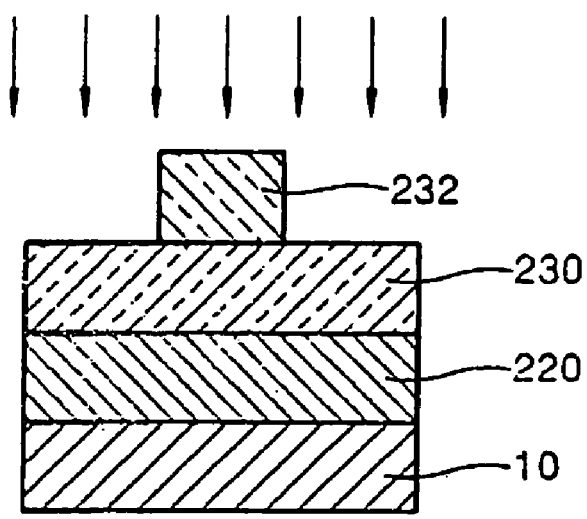
FIG. 2A through 2H are cross-sectional views illustrating a method of manufacturing a conventional MTJ cell.
Figure 2B:
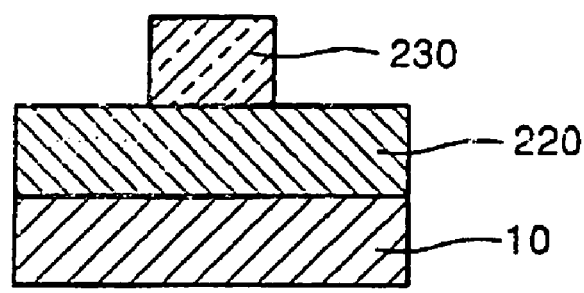
Figure 2C:
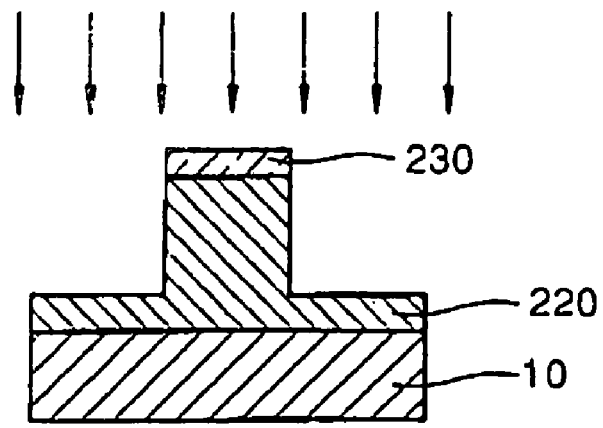
Figure 2D:
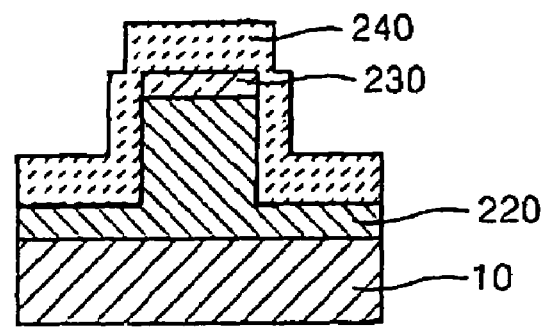
Figure 2E:
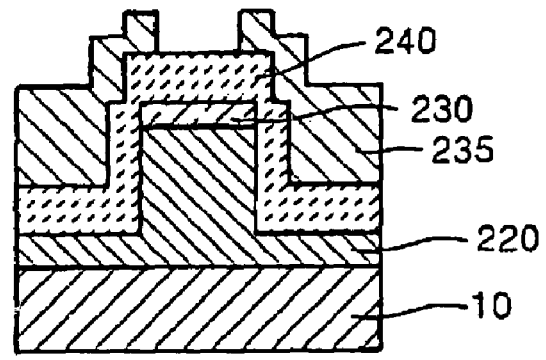
Figure 2F:
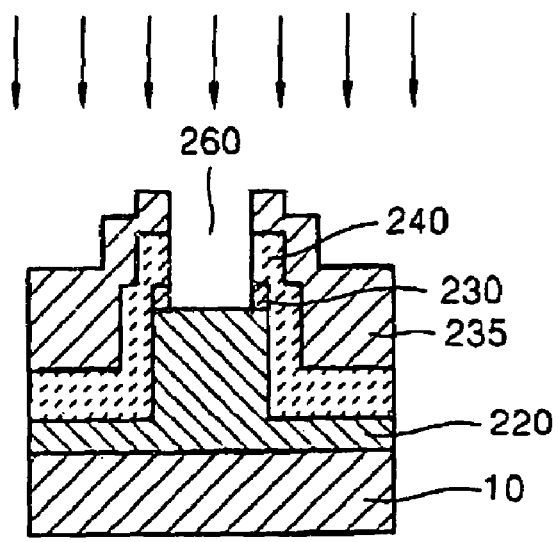
Figure 2G:
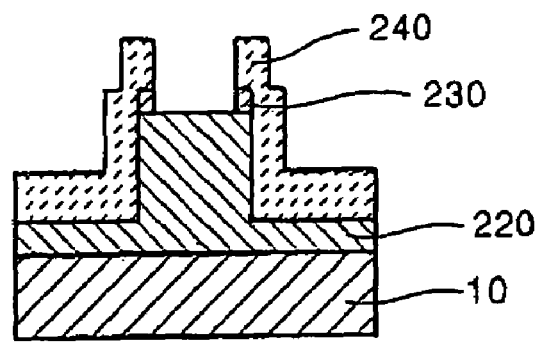
Figure 2H:
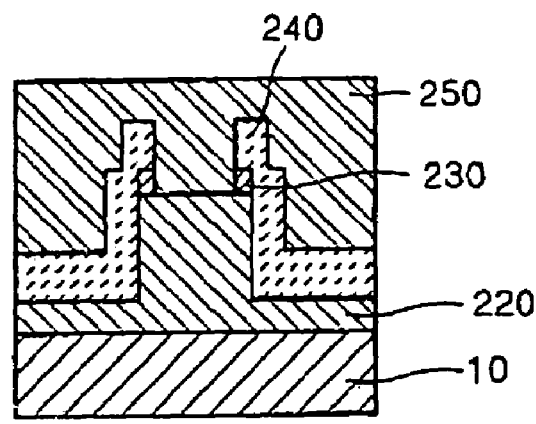
Figure 3:
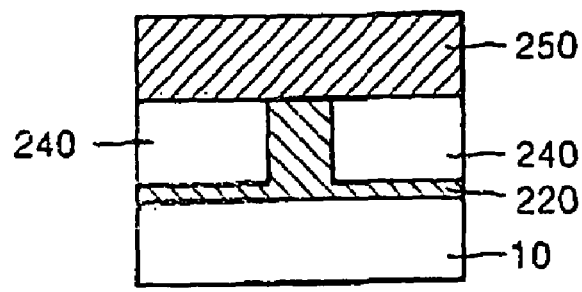
FIG. 3 is a cross-sectional view illustrating an MTJ cell according to an embodiment of the present disclosure.

FIG. 3 is a cross-sectional view of an MTJ cell according to an embodiment of the present disclosure. Comparing the MTJ cell according to an embodiment of the present disclosure and the conventional MTJ cell depicted in FIG. 2H, a metal layer 250 contacts an MTJ layer 220 via a contact hole 260 in the conventional MTJ cell, but in the present embodiment, the metal layer 50 contacts the MTJ layer 20 without the use of a contact hole. Accordingly, in embodiments of the present embodiment, a contact surface area is greater, and a very complicated process is not required for forming a contact hole.

FIGS. 4A through 4H are cross-sectional views illustrating a method of manufacturing an MTJ cell according to an embodiment of the present disclosure. More specifically, an MTJ layer 20 is formed on a semiconductor substrate 10. The semiconductor substrate 10 can be composed of a material such as Si or $SiO_2$, and a thickness of the MTJ layer 20 is in a range of 400~1500 Å.

Figure 4A:
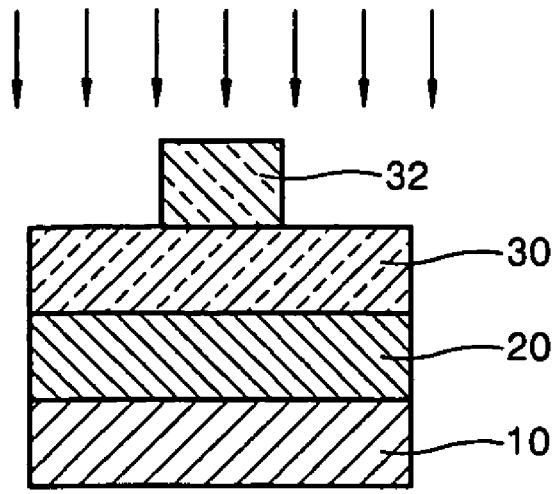
FIG. 4A through 4H are cross-sectional views illustrating a method of manufacturing an MTJ cell according to an embodiment of the present disclosure.
Figure 4B:
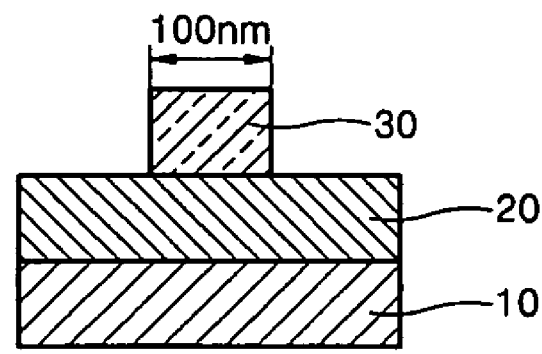

For convenience of explanation, the MTJ layer 20 is simply depicted as a single layer in FIG. 4, however, the MTJ layer 20 generally has a more complicated structure. That is, as illustrated in FIG. 5, the MTJ layer 20 includes a lower material film 22, an insulating film 23, an upper material film 24, and a cap layer 25 sequentially formed on a base layer 21. The lower material film 22 can be a single magnetic film, but can also include a plurality of material films including a magnetic film. For example, the lower material film 22 can be formed by sequentially stacking a tantalum (Ta) film, a ruthenium (Ru) film, iridium/manganese (Ir/Mn) film, and a synthetic antiferromagnetic (SAF) film. A nickel iron (NiFe) film can be used instead of the Ru film. The insulating film 23 for tunneling can be formed of aluminum oxide ($Al_2O_3$). The upper film 24 can also be composed to a single magnetic film like the lower film 22, but can also include a plurality of material films by sequentially stacking a cobalt iron (CoFe) film and a nickel iron (NiFe) film. The cap layer 25 includes a conductive film such as a tantalum film or a ruthenium film. The base layer 21 on which the lower material film 22 is formed can also be a conductive single layer or a conductive multiple material layer. When the base layer 21 is a multiple layer, the base layer 21 can be a Ti/TiN layer in which a titanium (Ti) film and a titanium nitride film (TiN) are sequentially stacked.

After the MTJ cell is formed, the base layer 21 is connected to a data line (not shown), and the cap layer 25 is connected to a bit line (not shown), for example.

When the MTJ layer 20 is stacked, a region for forming an MTJ cell (hereinafter, an MTJ cell region) is formed by etching a portion of the MTJ layer 20. At this time, the width and length of the MTJ cell region can each be less than 100 nm. To etch the MTJ layer 20 with such a minute pattern, a hard mask 30 having a high etching selectivity with respect to the MTJ layer 20 can be used. Another reason for using the hard mask 30 is because generally it is difficult to have a fine photo-resist coating on the tantalum or ruthenium used as a material for forming the cap layer 25 which is an uppermost layer of the MTJ layer 20. The hard mask 30 can be composed of $SiO_2$, $Si_3N_4$, fluorinated silicate glass (FSG), phosphorous silicate glass (PSG), or boron phosphorous silicate glass (BPSG). The thickness of the hard mask 30 can be determined according to a thickness of the MTJ layer 20, and can be in a range of 1000~8000 Å.

When the hard mask 30 is coated on the MTJ layer 20, a photo-resist 32 (or electron beam resist) with a size and pattern corresponding to the MTJ cell region is coated on the hard mask 30. FIG. 4A illustrates a state when the photo-resist 32 is coated on the hard mask 30. Then, a hard mask 30 is patterned by dry etching a portion of the hard mask 30 using the photo-resist 32 as an etch mask. Referring to FIG. 4B, the photo-resist 32 is removed by dry etching and the hard mask 30 has a size and pattern corresponding to the MTJ cell region. The etching gas used for the dry etching can be a gas such as $C_2F_6$, $C_4F_8$, or $CHF_3$.

Figure 4C:
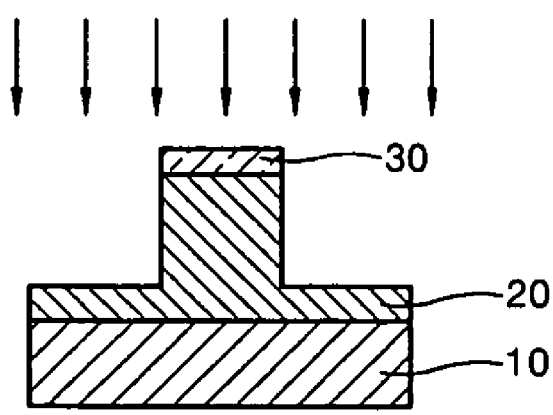
Figure 5:
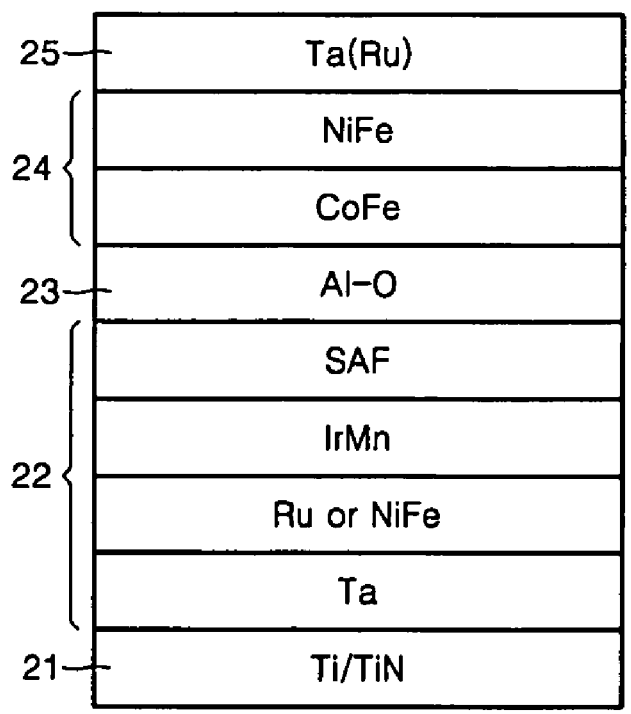
FIG. 5 illustrates the structure of an MTJ layer of an MTJ cell.

Next, referring to FIG. 4C, an MTJ cell region is formed by dry etching the MTJ layer 20 using the hard mask 30 as an etch mask. At this time, the MTJ layer 20 is not completely etched, but is etched until the base layer 21 of the MTJ layer 20 is exposed. That is, when the Ti or TiN, of which the base layer 21 is composed, is detected, the dry etching is terminated. The base layer 21 will perform as a conductive wire connected to a data line (not shown) and a CMOS (not shown), which controls the MTJ cell, located under the MTJ cell after the MRAM is manufactured. In this process, a small portion of the hard mask 30 may remain on the MTJ cell region, but this has no effect on the final product.

In more detail and referring to FIG. 5, the cap layer 25, the upper material film 24, the insulating film 23 and the lower material film 22 are sequentially etched using a predetermined plasma etching process. In this process, the etching conditions must be adjusted according to the material film to be etched. This can be achieved by independently controlling the composition of mixed gas used as an etching gas and a bias power applied to the substrate. At this time, the etching gas, which does not include chlorine ($Cl_2$), is a gas having a predetermined mixing ratio between a main gas and an additive gas. The main etching gas and the additive gas may be $BCl_3$ and Ar, respectively.

Figure 4D:
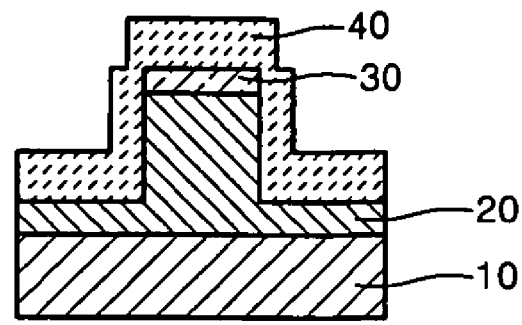

After forming the MTJ cell region, referring to FIG. 4D, an insulating layer 40 composed of $SiO_2$ or $Si_3N_4$ is formed on an exposed surface of the MTJ layer 20 using a plasma enhanced chemical vapor deposition (PECVD) method or a magnetron sputtering method. The insulating layer 40 insulates a metal layer 50 from other elements except the cap layer 25 when the metal layer 50 is formed. Therefore, a height of the insulating layer 40 (that is, the minimum height of the insulating layer 40 in FIG. 4D) formed outside the MTJ cell region (that is, the insulating layer 40 coated on the base layer 21 of the MTJ layer 20) has to be greater than a height of the cap layer 25 in the MTJ cell region.

Figure 4E:
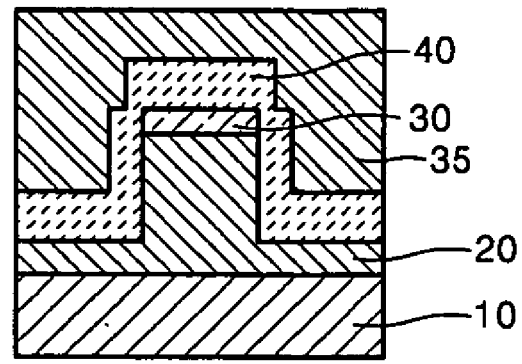

Then, referring to FIG. 4E, a mask layer 35 is coated on the insulating layer 40. The mask layer 35 is composed of a photo-resist such as polymide or an electron beam resist for dry etching in a subsequent process. The mask layer 35 can have a uniform height sufficient for a subsequent etching process.

Figure 4F:
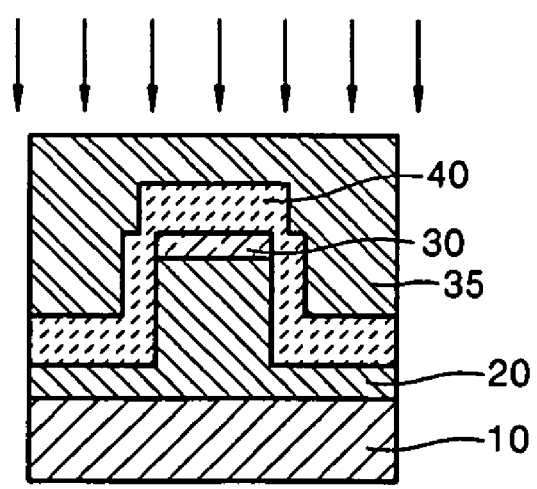

Then, referring to FIG. 4F, the insulating layer 40 and the mask layer 35 are etched at the same etching rate by dry etching. That is, the etching selectivity of the insulating layer 40 with respect to the mask layer 35 is 1:1. To etch the insulating layer 40 and the mask layer 35 at the same etching rate, a proper etching gas must be used for the dry etching. When the insulating layer 40 is composed of $SiO_2$ or $Si_3N_4$, $C_2F_6$ or $C_4F_8$ is used as a main gas and Ar or $0_2$ is used as an additive gas. The dry etching is terminated at the cap layer 25, which is the uppermost layer of the MTJ layer 20. That is, when the Ta or Ru which is a component of the cap layer 25 is detected during etching, the etching is terminated.

Figure 4G:
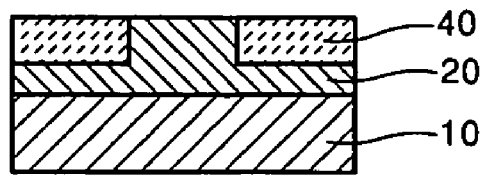

After completing the dry etching, a portion of the mask layer 35 remaining on the etched surface is removed by dry etching or organic cleaning so that the metal layer 50 can be formed in a subsequent process. At this time, the dry etching or organic cleaning must remove only the remained photo-resist 32 or an e-beam resist and not affect the insulating layer 40 and the MTJ layer 20. Since the mask layer 35 is a polymer composed of elements such as C, H, and O, the mask layer 35 is removed by producing volatile material such as CO or $CO_2$ in ashing equipment using oxygen. In the present embodiment, since the insulating layer 40 and the mask layer 35 are etched at the same etching rate, the insulating layer 40 and the MTJ layer 20 form a planarized surface as depicted in FIG. 4G.

Figure 4H:
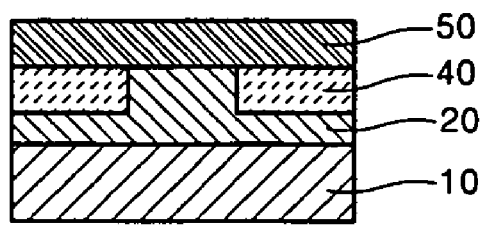

Then, referring to FIG. 4H, a metal layer 50 composed of Ti, TiN, Ta, or Al is formed on the insulating layer 40 and MTJ layer 20 using a sputtering method. As described above, a relatively wide contact is formed between the cap layer 25 of the MTJ layer 20 and the metal layer 50 without forming a contact hole.

As described above, a method of manufacturing an MTJ cell according to the present disclosure enables the manufacturing of a MTJ cell having a width of 100 nm, which is impossible to manufacture using a conventional method in which a contact is formed in a contact hole. Also, the contact formed according to an embodiment of the present disclosure has a relatively low resistance because a relatively wide contact can be manufactured without forming a contact hole. Additionally, lithography and dry etching processes required for forming a conventional contact hole are unnecessary and overall process control is relatively simple, while time and costs for manufacturing an MTJ cell are reduced.

As a result, according to an embodiment of the present disclosure, a high integrated memory cell can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a magnetic tunnel junction (MTJ) cell, comprising:
    forming an MTJ layer on a substrate;
    forming an MTJ cell region by patterning the MTJ layer;
    sequentially depositing an insulating layer and a mask layer on the MTJ layer including the cell region;
    exposing an upper surface of the MTJ cell region by etching the mask layer and the insulating layer at the same etching rate; and
    depositing a metal layer on the insulating layer and the MTJ layer.

2. The method of claim 1, wherein the MTJ layer includes a base layer that is conductive, a lower material layer having magnetic properties, an insulating internal MTJ layer, an upper material layer having magnetic properties, and a cap layer that is conductive stacked sequentially.

3. The method of claim 2, wherein the insulating internal MTJ film is composed of a material comprising aluminum oxide ($Al_2O_3$).

4. The method of claim 2, wherein the forming the MTJ cell region by patterning the MTJ layer comprises:
    depositing a hard mask on the MTJ layer;
    patterning the hard mask by first dry etching; and
    forming the MTJ cell region by second dry etching the MTJ layer to a depth using the hard mask as an etch mask.

5. The method of claim 4, wherein the patterning the hard mask comprises:
    coating a photo-resist on the hard mask with a size corresponding to the MTJ cell region; and
    etching the hard mask by the first dry etching using the photo-resist as an etch mask.

6. The method of claim 5, wherein the hard mask is composed of a material including at least one material selected form the group consisting of $SiO_2$, $Si_3N_4$, fluorinated silicate glass (FSG), phosphorous silicate glass (PSG), and boron phosphors silicate glass (BPSG).

7. The method of claim 5, wherein an etching gas used for the first dry etching includes a fluorine group etching gas including at least one compound selected from the group consisting of $C_2F_6$, $C_4F_8$, and $CHF_3$.

8. The method of claim 4, wherein the MTJ layer is etched until the base layer is exposed.

9. The method of claim 4, wherein the etching gas used for the second dry etching includes $BCl_3$ as a main gas and Ar as an additive gas.

10. The method of claim 4, wherein a width and length of the MTJ cell region are each less than 100 nm.

11. The method of claim 4, wherein a thickness of the hard mask is in a range of 1000~8000 Å.

12. The method of claim 4, wherein a thickness of the MTJ layer is in a range of 400~1500 Å.

13. The method of claim 2, wherein a height of the insulating layer deposited on a region outside the MTJ cell region is at least greater than a height of the cap layer of the MTJ layer.

14. The method of claim 13, wherein the insulating layer is composed of at least one compound selected from the group consisting of $SiO_2$ and $Si_3N_4$.

15. The method of claim 13, wherein the mask layer deposited on the insulating layer has a planarized upper surface.

16. The method of claim 1, wherein the etching the insulating layer and the mask layer comprises:
    third dry etching the insulating layer and the mask layer at the same etching rate;
    terminating the third dry etching when the MTJ cell region is exposed; and
    removing a remaining portion of the mask layer.

17. The method of claim 16, wherein third dry of etching is terminated when a component of the cap layer is detected.

18. The method of claim 16, wherein the etching gas used for the third dry etching includes at least one gas selected from the group consisting of $C_2F_6$ and $C_4F_8$ as a main gas and at least one gas selected from the group consisting of Ar and $O_2$ as an additive gas such that the insulating layer and the mask layer are etched at the same etching rate.

19. The method of claim 16, wherein the removing the remaining portion of the mask layer uses an ashing method in which the mask layer is removed by producing volatile reaction products-using oxygen.

20. The method of claim 1, wherein the metal layer is composed of at least one metal selected from the group consisting of Ti, TiN, Ta, and Al.

21. A magnetic tunnel junction (MTJ) cell formed in accordance with the method of claim 1.

* * * * *